United States Patent
Tsutsumi

(10) Patent No.: US 10,193,051 B2
(45) Date of Patent: Jan. 29, 2019

(54) ACOUSTIC WAVE DEVICE

(71) Applicant: TAIYO YUDEN CO., LTD., Tokyo (JP)

(72) Inventor: Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 513 days.

(21) Appl. No.: 14/704,552

(22) Filed: May 5, 2015

(65) Prior Publication Data

US 2015/0340587 A1    Nov. 26, 2015

(30) Foreign Application Priority Data

May 23, 2014    (JP) ................. 2014-106794

(51) Int. Cl.
| | | |
|---|---|---|
| *H03H 9/25* | (2006.01) | |
| *H01L 41/047* | (2006.01) | |
| *H03H 9/02* | (2006.01) | |
| *H03H 9/145* | (2006.01) | |

(52) U.S. Cl.
CPC ....... *H01L 41/047* (2013.01); *H03H 9/02559* (2013.01); *H03H 9/02992* (2013.01); *H03H 9/14538* (2013.01); *H03H 9/14544* (2013.01)

(58) Field of Classification Search
CPC .............. H01L 41/047; H03H 9/02559; H03H 9/02992; H03H 9/14538; H03H 9/14544
USPC .................. 310/313 D, 313 R; 333/193, 195
See application file for complete search history.

(56) References Cited

U.S. PATENT DOCUMENTS

| | | | | |
|---|---|---|---|---|
| 5,283,037 A | * | 2/1994 | Baer .................... | G01N 29/022 310/311 |
| 5,568,001 A | * | 10/1996 | Davenport ......... | H03H 9/14538 310/312 |
| 5,631,515 A | * | 5/1997 | Mineyoshi ......... | H03H 9/02866 310/313 B |

(Continued)

FOREIGN PATENT DOCUMENTS

| | | | | |
|---|---|---|---|---|
| CN | | 104205630 A | 12/2014 | |
| EP | | 0909026 A2 | * 4/1999 | ............. H03H 9/145 |

(Continued)

OTHER PUBLICATIONS

Chinese Office Action dated Jul. 18, 2017, in a counterpart Chinese patent application No. 201510263359.2.

(Continued)

*Primary Examiner* — Thomas Dougherty
(74) *Attorney, Agent, or Firm* — Chen Yoshimura LLP

(57) ABSTRACT

An acoustic wave device includes: an IDT provided on a piezoelectric substrate; and gratings provided on both sides of the IDT, wherein: a slowness surface of an acoustic wave has a concave shape; a duty ratio of electrode fingers of the gratings is larger than that of the electrode fingers of the IDT, or a thickness of the electrode fingers of the gratings is larger than that of the electrode fingers of the IDT, or a thickness of an added film provided on the electrode fingers of the gratings is larger than that of an added film provided on the electrode fingers of the IDT; a pitch of the electrode fingers of the gratings is smaller than that of the electrode fingers of the IDT; and a resonant frequency of the gratings is substantially the same as that of the IDT.

5 Claims, 19 Drawing Sheets

(56) References Cited

U.S. PATENT DOCUMENTS

| | | | | |
|---|---|---|---|---|
| 5,818,146 A * | 10/1998 | Kurahashi | H03H 9/6433 | 310/313 R |
| 6,011,344 A * | 1/2000 | Dufilie | H03H 9/0028 | 310/313 B |
| 6,369,674 B1 * | 4/2002 | Matsumoto | H03H 9/6436 | 310/313 D |
| 6,498,548 B2 * | 12/2002 | Kaneda | H03H 9/6433 | 310/313 A |
| 6,900,577 B2 * | 5/2005 | Takamine | H03H 9/0028 | 310/313 D |
| 6,946,931 B2 * | 9/2005 | Inoue | H03H 9/14567 | 310/313 B |
| 7,453,334 B1 | 11/2008 | Abbott et al. | | |
| 2003/0042998 A1 * | 3/2003 | Edmonson | H03H 9/25 | 333/195 |
| 2003/0193668 A1 | 10/2003 | Wakana et al. | | |
| 2006/0146314 A1 | 7/2006 | Wakana et al. | | |
| 2008/0315972 A1 | 12/2008 | Mayer et al. | | |
| 2010/0102669 A1 * | 4/2010 | Yamanaka | H03H 9/02551 | 310/313 D |
| 2011/0068655 A1 * | 3/2011 | Solal | H03H 9/02858 | 310/313 B |
| 2011/0204984 A1 * | 8/2011 | Yamanaka | H03H 9/02551 | 331/154 |
| 2012/0007475 A1 * | 1/2012 | Ruile | H03H 3/02 | 310/363 |
| 2012/0068790 A1 * | 3/2012 | Yoshimoto | H03H 9/02921 | 333/195 |
| 2012/0139662 A1 * | 6/2012 | Fujiwara | H03H 9/02559 | 333/133 |
| 2012/0286624 A1 | 11/2012 | Ikeuchi | | |
| 2013/0051588 A1 | 2/2013 | Ruile et al. | | |
| 2013/0176087 A1 * | 7/2013 | Hosonuma | H03H 9/0085 | 333/193 |
| 2013/0249647 A1 | 9/2013 | Nakanishi et al. | | |
| 2013/0278358 A1 * | 10/2013 | Tsuda | H03H 9/64 | 333/195 |
| 2014/0015624 A1 * | 1/2014 | Kishino | H03H 9/1085 | 333/187 |
| 2014/0361850 A1 * | 12/2014 | Inoue | H03H 9/725 | 333/133 |
| 2015/0070227 A1 | 3/2015 | Kishino et al. | | |
| 2016/0049920 A1 * | 2/2016 | Kishino | H03H 9/0033 | 343/858 |
| 2016/0182010 A1 * | 6/2016 | Nakamura | H03H 9/64 | 333/193 |
| 2017/0104470 A1 * | 4/2017 | Koelle | H03H 9/02708 | |

FOREIGN PATENT DOCUMENTS

| | | | | |
|---|---|---|---|---|
| JP | 11-298286 A | | 10/1999 | |
| JP | 2000-341073 A | | 12/2000 | |
| JP | 2003-87083 A | | 3/2003 | |
| JP | 2004-003953 A | | 1/2004 | |
| JP | 2004343259 A | * | 12/2004 | H03H 9/145 |
| JP | 2006-229754 A | | 8/2006 | |
| JP | 2007-96527 A | | 4/2007 | |
| JP | 2008-113273 A | | 5/2008 | |
| JP | 2012-65272 A | * | 3/2012 | H03H 9/145 |
| JP | 2013-518455 A | | 5/2013 | |
| WO | 2011/108229 A1 | | 9/2011 | |
| WO | 2012/132238 A1 | | 10/2012 | |

OTHER PUBLICATIONS

Japanese Office Action dated Jan. 23, 2018, in a counterpart Japanese patent application No. 2014-106794. (A machine translation (not reviewed for accuracy) attached.).

Japanese Office Action dated Jul. 31, 2018, in a counterpart Japanese patent application No. 2014-106794. (A machine translation (not reviewed for accuracy) attached.).

* cited by examiner

ACOUSTIC WAVE DEVICE

CROSS-REFERENCE TO RELATED APPLICATION

This application is based upon and claims the benefit of priority of the prior Japanese Patent Application No. 2014-106794, filed on May 23, 2014, the entire contents of which are incorporated herein by reference.

FIELD

A certain aspect of the present invention relates to an acoustic wave device, and in particular, relates to an acoustic wave device having an IDT.

BACKGROUND

Recently, high performance is progressed in mobile communication devices represented by smart phones or mobile phones. For example, handling is rapidly shifted from a third generation system to an LTE (Long Term Evolution). In the LTE, a data communication of a large capacity is performed with a higher speed. Therefore, specs demanded for high frequency components becomes higher. Reduction of an insertion loss of filters or duplexers using an acoustic wave device is being demanded. There are acoustic wave devices in which an IDT (Interdigital Transducer) is provided on a piezoelectric substrate such as surface acoustic wave devices, as acoustic wave devices used in mobile communication devices or the like.

Japanese Patent Application Publications No. 2000-341073, No. 2003-87083, No. 2008-113273, No. 11-298286 and No. 2013-518455 disclose that gratings are provided on both sides of an IDT in an aperture direction thereof in a surface acoustic wave device.

SUMMARY OF THE INVENTION

According to an aspect of the present invention, there is provided an acoustic wave device including: an IDT that is provided on a piezoelectric substrate and excites an acoustic wave; and gratings that are provided on both sides of the IDT in an aperture direction thereof, wherein: a slowness surface of an acoustic wave in a main propagation direction in a region where electrode fingers of the IDT cross each other has a concave shape; a duty ratio of electrode fingers of the gratings is larger than a duty ratio of the electrode fingers of the IDT, or a thickness of the electrode fingers of the gratings is larger than a thickness of the electrode fingers of the IDT, or a thickness of an added film provided on the electrode fingers of the gratings is larger than a thickness of an added film provided on the electrode fingers of the IDT; a pitch of the electrode fingers of the gratings is smaller than a pitch of the electrode fingers of the IDT; and a resonant frequency of the gratings is substantially the same as a resonant frequency of the IDT.

According to an aspect of the present invention, there is provided an acoustic wave device including: an IDT that is provided on a piezoelectric substrate and excites an acoustic wave; and gratings that are provided on both sides of the IDT in an aperture direction thereof, wherein: a slowness surface of an acoustic wave in a main propagation direction in a region where electrode fingers of the IDT cross each other has a concave shape; a duty ratio of electrode fingers of the gratings is larger than a duty ratio of the electrode fingers of the IDT, or a thickness of the electrode fingers of the gratings is larger than a thickness of the electrode fingers of the IDT, or a thickness of an added film provided on the electrode fingers of the gratings is larger than a thickness of an added film provided on the electrode fingers of the IDT; a pitch of the electrode fingers of the gratings is smaller than a pitch of the electrode fingers of the IDT; and the electrode fingers of the gratings and the electrode fingers of the ID are connected to each other via bended regions.

According to an aspect of the present invention, there is provided an acoustic wave device comprising: an IDT that is provided on a piezoelectric substrate and excites an acoustic wave; and gratings that are provided on both sides of the IDT in an aperture direction thereof, wherein: a slowness surface of an acoustic wave in a main propagation direction in a region where electrode fingers of the IDT cross each other has a concave shape; a duty ratio of electrode fingers of the gratings is larger than a duty ratio of the electrode fingers of the IDT, or a thickness of the electrode fingers of the gratings is larger than a thickness of the electrode fingers of the IDT, or a thickness of an added film provided on the electrode fingers of the gratings is larger than a thickness of an added film provided on the electrode fingers of the IDT; and the electrode fingers of the gratings are inclined with respect to the aperture direction.

According to an aspect of the present invention, there is provided an acoustic wave device comprising: an IDT that is provided on a piezoelectric substrate and excites an acoustic wave; and gratings that are provided on both sides of the IDT in an aperture direction thereof, wherein: a slowness surface of an acoustic wave in a main propagation direction in a region where electrode fingers of the IDT cross each other has a convex shape; a duty ratio of electrode fingers of the gratings is smaller than a duty ratio of the electrode fingers of the IDT, or a thickness of the electrode fingers of the gratings is smaller than a thickness of the electrode fingers of the IDT, or a thickness of an added film provided on the electrode fingers of the gratings is smaller than a thickness of an added film provided on the electrode fingers of the IDT; a pitch of the electrode fingers of the gratings is larger than a pitch of the electrode fingers of the IDT; and a resonant frequency of the gratings is substantially the same as a resonant frequency of the IDT.

According to an aspect of the present invention, there is provided an acoustic wave device comprising: an IDT that is provided on a piezoelectric substrate and excites an acoustic wave; and gratings that are provided on both sides of the IDT in an aperture direction thereof, wherein: a slowness surface of an acoustic wave in a main propagation direction in a region where electrode fingers of the IDT cross each other has a convex shape; a duty ratio of electrode fingers of the gratings is smaller than a duty ratio of the electrode fingers of the IDT, or a thickness of the electrode fingers of the gratings is smaller than a thickness of the electrode fingers of the IDT, or a thickness of an added film provided on the electrode fingers of the gratings is smaller than a thickness of an added film provided on the electrode fingers of the IDT; a pitch of the electrode fingers of the gratings is larger than a pitch of the electrode fingers of the IDT; and the electrode fingers of the gratings and the electrode fingers of the IDT are connected to each other via bended regions.

DETAILED DESCRIPTION

When gratings are provided on both sides of an IDT, a leakage of an acoustic wave in an aperture direction from an IDT region can be suppressed. Therefore, an insertion loss can be suppressed. However, suppressing of the leakage of the acoustic wave is not sufficient.

Figure 1A:
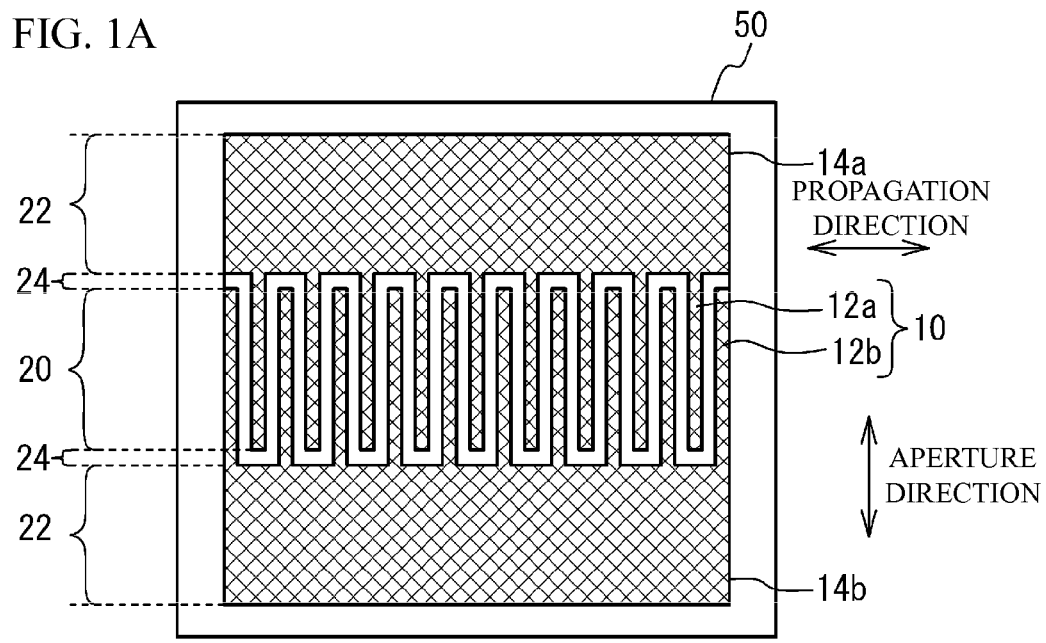
FIG. 1A illustrates a plane view of an acoustic wave device in accordance with a first comparative example.
Figure 1B:
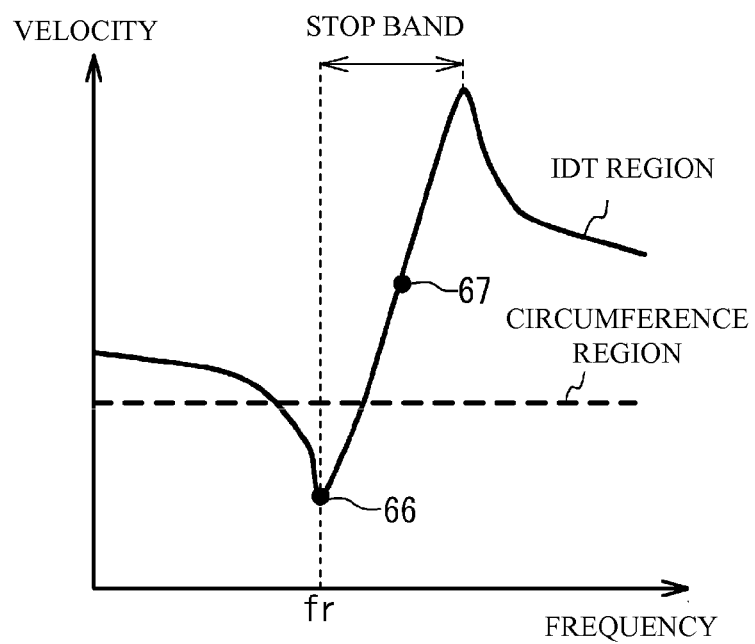
FIG. 1B illustrates a velocity of an acoustic wave with respect to a frequency of a first comparative example.

A description will be given of leakage of a surface acoustic wave that is one of factors suppressing low loss of a surface acoustic wave device. FIG. 1A illustrates a plane view of an acoustic wave device in accordance with a first comparative example. FIG. 1B illustrates a velocity of an acoustic wave with respect to a frequency of the first comparative example. As illustrated in FIG. 1A, the acoustic wave device of the first comparative example has a structure in which an IDT 10 is formed on a piezoelectric substrate 50. The IDT 10 has a plurality of electrode fingers 12a and a plurality of electrode fingers 12b. The plurality of the electrode fingers 12a and 12b are respectively connected to a bus bar 14a and a bus bar 14b. The electrode fingers 12a and 12b are substantially provided alternately. A direction in which a surface acoustic wave propagates is a propagation direction. An extension direction of the electrode fingers 12a and 12b is an aperture direction. The propagation direction is vertical to the aperture direction. A region where the electrode fingers 12a overlap with the electrode fingers 12b is an IDT region 20. Regions of the bus bars 14a and 14b are circumference regions 22. A gap region 24 is provided between the IDT region 20 and the circumference regions 22.

As illustrated in FIG. 1B, in the IDT region 20, a velocity of an acoustic wave is minimum at a frequency fr of a resonant frequency 66. The velocity is maximum on a high frequency side with respect to the resonant frequency fr. A frequency band between the resonant frequency at which the velocity is minimum and the frequency at which the velocity is maximum is a stop band. An anti-resonant frequency 67 appears in the stop band. In the first comparative example, the circumference regions 22 are the bus bar 14a and the bus bar 14b and have a uniform structure. Therefore, the velocity of the acoustic wave in the circumference region 22 is constant.

It is thought that a part of energy leaks in the aperture direction as one of factors suppressing low loss of a surface acoustic wave device when a surface acoustic wave propagates in the propagation direction. It is possible to explain the leakage of the energy in the aperture direction if the IDT 10 and the bus bars 14a and 14b are considered as a waveguide of the surface acoustic wave. That is, it is determined whether energy of an acoustic wave is confined in the IDT region 20, based on large and small of the velocity of the acoustic wave propagating in the IDT region 20 and the circumference region 22.

Figure 2A:
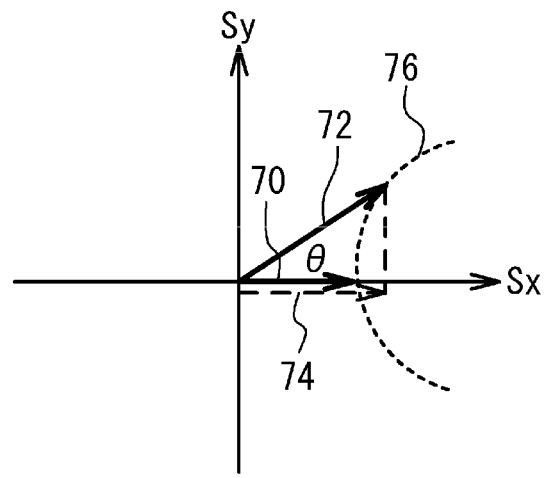
FIG. 2A to FIG. 2C illustrates a slowness Sy of an acoustic wave in an aperture direction with respect to a slowness Sx of the acoustic wave in a propagation direction.
Figure 2B:
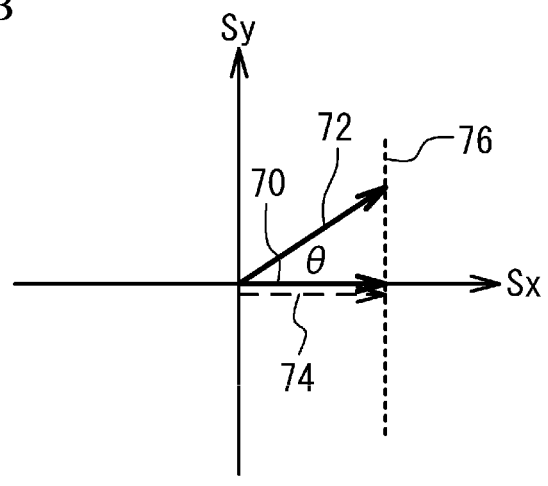
Figure 2C:
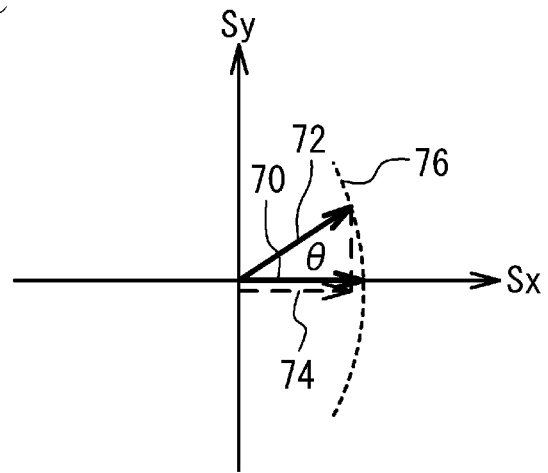

FIG. 2A to FIG. 2C illustrate a slowness Sy of the acoustic wave in the aperture direction with respect to a slowness Sx of the acoustic wave in the propagation direction. The slowness is a reciprocal number of a phase velocity of the acoustic wave. As illustrated in FIG. 2A to FIG. 2C, the slowness of the acoustic wave of the propagation direction is referred to as a slowness 70. A slowness of the acoustic wave inclined to a Y-direction from an X-direction by an angle θ is referred to as a slowness 72. An edge face of the reverse velocities 70 and 72 is a slowness surface 76. A projected component of the slowness 72 in the X-direction is referred to as a projected component 74. In FIG. 2A, the projected component 74 is larger than the slowness 70. In this case, the slowness surface 76 has a concave shape with respect to an origin. In FIG. 2B, the projected component 74 is the same as the slowness 70. In this case, the slowness surface 76 is a flat face. In FIG. 2C, the projected component 74 is smaller than the slowness 70. In this case, the slowness surface 76 has a convex shape with respect to the origin.

In this manner, when the projected component 74 of the slowness 72 in a main propagation direction of an acoustic wave propagating in an inclined direction with respect to the main propagation direction is larger than the slowness 70 of the acoustic wave propagating in the main propagation direction, the slowness surface is a concave type. When the projected component 74 of the slowness 72 in the main propagation direction of the acoustic wave propagating in an inclined direction with respect to the main propagation direction is smaller than the slowness 70 of the acoustic wave propagating in the main propagation direction, the slowness surface is a convex type. Whether the slowness surface is the convex type or the concave type is determined by a type of the piezoelectric substrate 50 or the like. For example, when a rotated Y-cut $LiTaO_3$ substrate is used, the type is the concave type. When a rotated Y-cut $LiNbO_3$ substrate is used, the type is the convex type.

Figure 3A:
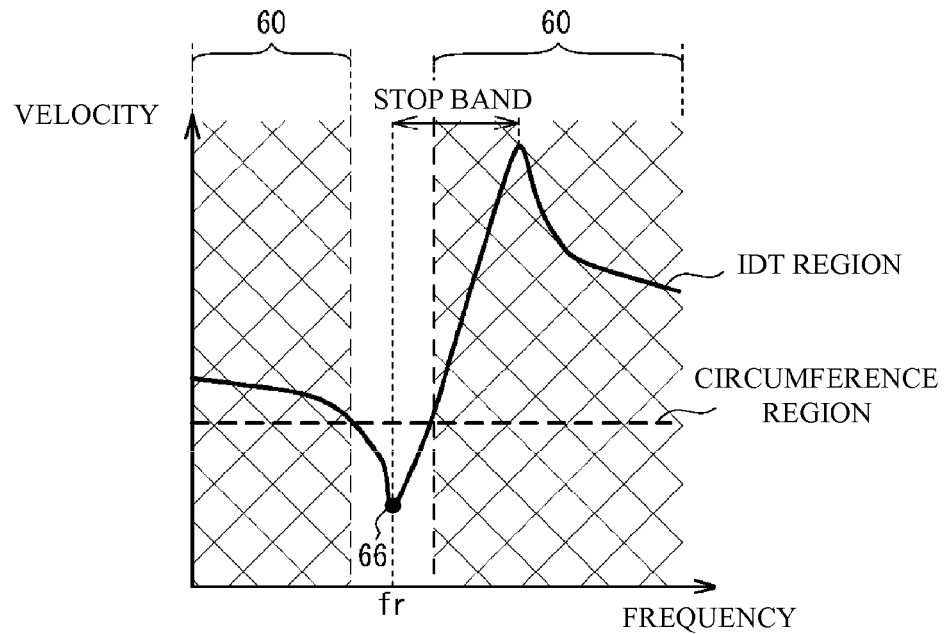
FIG. 3A illustrates a frequency range in which an acoustic wave is confined in an aperture direction in a case where a slowness surface of a first comparative example in a propagation direction is a concave type.
Figure 3B:
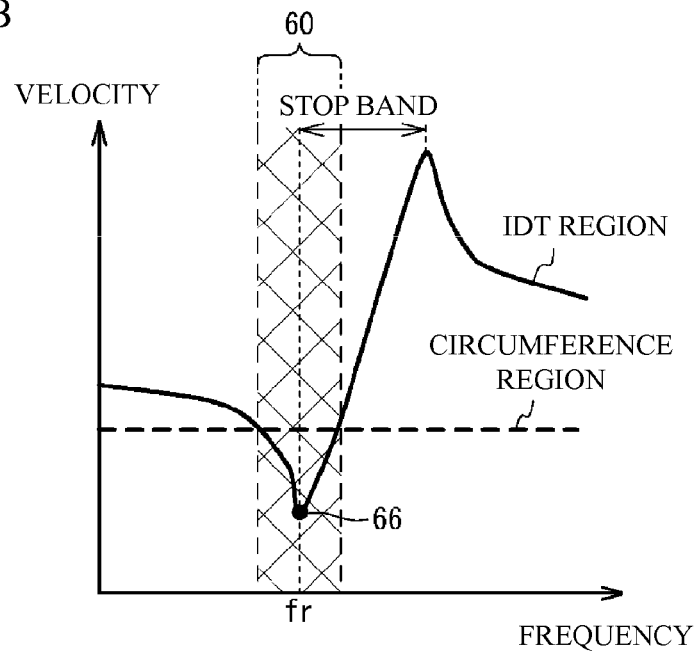
FIG. 3B illustrates a frequency range in which an acoustic wave is confined in an aperture direction in a case where a slowness surface of a first comparative example in a propagation direction is a convex type.

FIG. 3A illustrates a frequency range in which an acoustic wave is confined in the aperture direction in a case where the slowness surface of the first comparative example in the propagation direction is the concave type. FIG. 3B illustrates a frequency range in which the acoustic wave is confined in the aperture direction in a case where the slowness surface of the first comparative example in the propagation direction is the convex type. A solid line indicates a velocity of the acoustic wave in the IDT region 20. A broken line indicates a velocity of the acoustic wave in the circumference region 22. As illustrated in FIG. 3A and FIG. 3B, a behavior of the acoustic wave in the IDT region 20 is the same as FIG. 1B. Therefore, an explanation of the behavior is omitted. In the first comparative example, the circumference regions 22 are the bus bars 14a and 14b and have a uniform structure. Therefore, the velocity of the acoustic wave in the circumference region 22 is constant.

As illustrated in FIG. 3A, in the concave type, the energy of the acoustic wave is confined in the IDT region 20 in a frequency range 60 in which the velocity of the acoustic wave in the IDT region 20 is larger than the velocity of the acoustic wave in the circumference region 22. On the other hand, the energy of the acoustic wave is leaked into the circumference region 22 from the IDT region 20 in a frequency range in which the velocity of the acoustic wave in the IDT region 20 is smaller than the velocity of the acoustic wave in the circumference region 22.

As illustrated in FIG. 3B, in the convex type, the energy of the acoustic wave is confined in the IDT region 20 in the frequency range 60 in which the velocity of the acoustic wave in the IDT region 20 is smaller than the velocity of the acoustic wave in the circumference region 22. On the other hand, the energy of the acoustic wave is leaked to the circumference region 22 from the IDT region 20 in a frequency range in which the velocity of the acoustic wave in the IDT region 20 is larger than the velocity of the acoustic wave in the circumference region 22.

Figure 6:
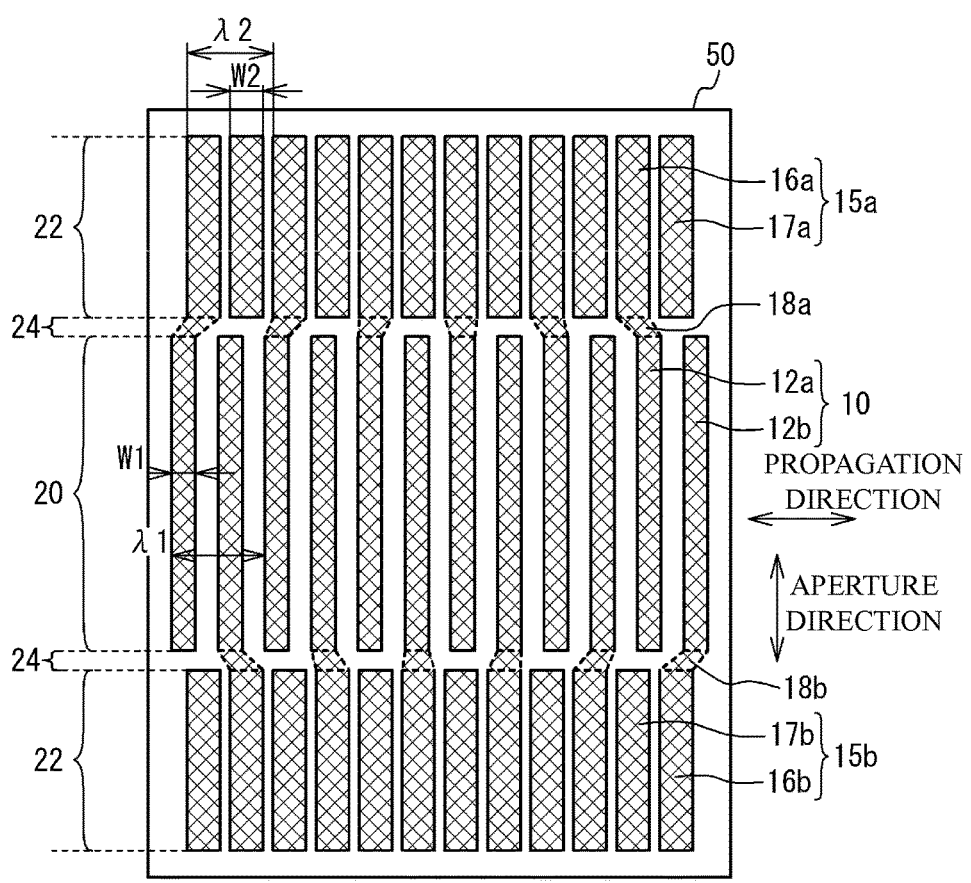
FIG. 6 illustrates a plane view of an acoustic wave device in accordance with a first embodiment.

And so, in a second comparative example, as illustrated in FIG. 6 of Document 1, the circumference region 22 has a grating, and a duty ratio (occupancy of line) between the grating and the electrode fingers 12a is different from a duty ratio between the grating and the electrode fingers 12b. In the second comparative example, in the concave type, the duty ratio of the grating is larger than the duty ratio of the electrode finger in the IDT.

Figure 4:
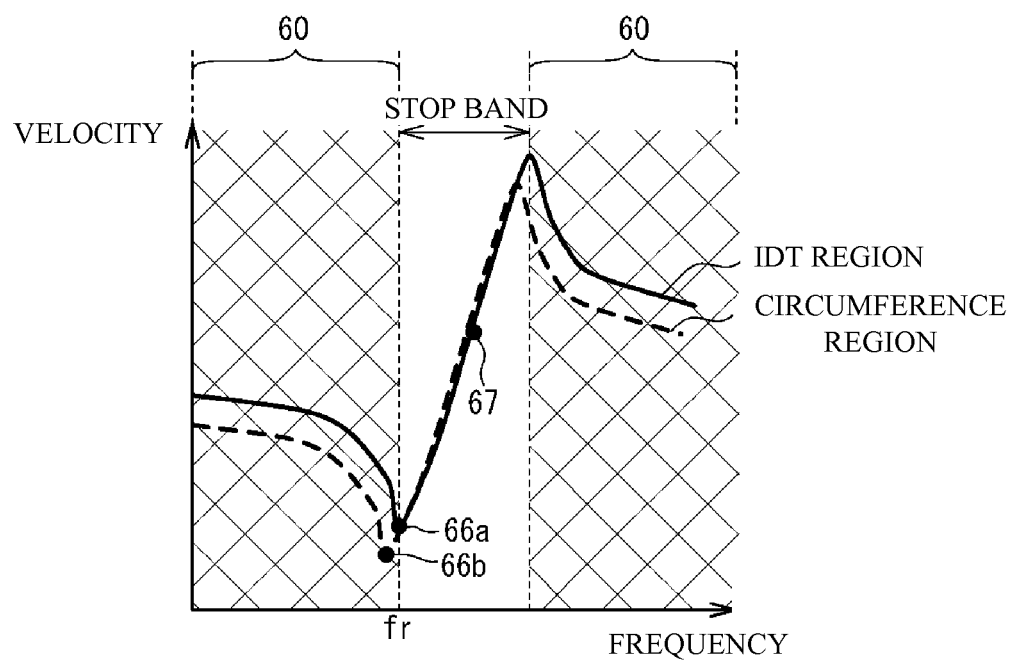
FIG. 4 illustrates a frequency range in which an acoustic wave is confined in an aperture direction in a case where a slowness surface of a propagation direction of a second comparative example is a concave type.

FIG. 4 illustrates a frequency range in which the acoustic wave is confined in the aperture direction in a case where the slowness surface of the propagation direction of the second comparative example is the concave type. As illustrated in FIG. 4, when the duty ratio of the electrode finger in the grating is enlarged, the velocity of the acoustic wave in the circumference region 22 becomes smaller along an inclination of the velocity in the stop band. Thus, a resonant frequency 66b of the grating is shifted to a low frequency side with respect to a resonant frequency 66a of the IDT. Therefore, outside of the stop band, the velocity of the acoustic wave in the circumference region 22 is smaller than that of the IDT region 20. However, in the stop band, the velocity of the acoustic wave in the circumference region 22 is substantially the same as that of the IDT region 20. Therefore, the frequency range 60 in which the energy of the acoustic wave is confined in the IDT region 20 is outside of the stop band. Moreover, in a simulation of the present inventors, when the velocity of the acoustic wave of the IDT region 20 is consistent with that of the circumference region 22, the leakage of the energy of the acoustic wave to the circumference region 22 is remarkable. Therefore, in the second comparative example, in the stop band, an energy loss becomes larger, and an insertion loss becomes larger.

First Embodiment

Figure 5:
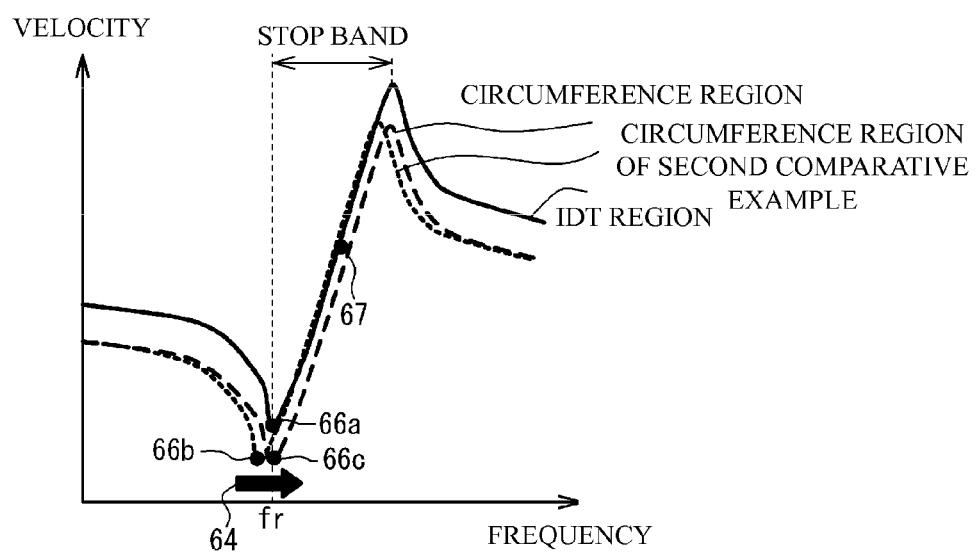
FIG. 5 illustrates a velocity of an acoustic wave with respect to a frequency in a first embodiment.

A first embodiment is an example of the concave type. FIG. 5 illustrates a velocity of an acoustic wave with respect to a frequency in the first embodiment. As illustrated in FIG. 5, in the first embodiment, velocity characteristics of the acoustic wave in the circumference region 22 is shifted to a high frequency side from the second comparative example (dotted line) as indicated with an arrow 64. That is, the resonant frequency 66b of the circumference region 22 of the second comparative example is shifted to a resonant frequency 66c and is consistent with the resonant frequency 66a of the IDT region 20. Thus, in the stop band, the velocity in the circumference region 22 can be smaller than the velocity in the IDT region 20. Therefore, the leakage of the energy of the acoustic wave to the circumference region 22 can be suppressed.

FIG. 6 illustrates a plane view of an acoustic wave device in accordance with the first embodiment. As illustrated in FIG. 6, the IDT 10, gratings 15a and 15b and connection fingers 18a and 18b that are made of a metal film such as an aluminum film or a copper film are provided on the piezoelectric substrate 50. Thicknesses of the metal films of the IDT 10, the gratings 15a and 15b and the connection fingers 18a and 18b are approximately uniform. The piezoelectric substrate 50 is a concave type substrate, and for example a rotated Y-cut $LiTaO_3$ substrate. The IDT 10 has the electrode fingers 12a and 12b. A region where the electrode fingers 12a and 12b overlap with each other is the IDT region 20. A different voltage is applied to the electrode fingers 12a and 12b. Thus, the electrode fingers 12a and 12b excite a surface acoustic wave propagating in the propagation direction. The electrode fingers 12a and 12b are approximately alternately provided. When a pitch and a width of the electrode fingers 12a and 12b in the IDT 10 are respectively λ1 and W1, a duty ratio of the electrode fingers 12a and 12b is 2×W1/λ1.

The gratings 15a and 15b are respectively formed in the circumference regions 22 on the both sides of the IDT region 20 in the aperture direction. The grating 15a has electrode fingers 16a and 17a. The grating 15b has electrode fingers 16b and 17b. The electrode finger 16a is connected to the electrode finger 12a via a connection finger 18a. The electrode finger 16b is connected to the electrode finger 12b via a connection finger 18b. The electrode fingers 17a and 17b of the gratings 15a and 15b are dummy electrodes and are not connected to the electrode fingers 12a and 12b. The electrode fingers 16a and the dummy electrode fingers 17a are approximately alternately provided. The electrode fingers 16b and the dummy electrode fingers 17b are approximately alternately provided. An outermost electrode finger of the circumference region 22 and an outermost electrode finger of the IDT region 20 are provided off each other in the propagation direction. The duty ratio is $2 \times W2/\lambda 2$, when a pitch and a width of the electrode fingers 16a, 16b, 17a and 17b of the gratings 15a and 15b in the propagation direction are $\lambda 2$ and W2.

A gap between the IDT region 20 and the circumference region 22 is the gap region 24. In the gap region 24, the connection fingers 18a and 18b are provided. The duty ratio of the IDT region 20 is different from that of the circumference region 22. Therefore, the connection fingers 18a and 18b have a trapezoidal shape. The pitch of the electrode fingers of the IDT region 20 is different from that of the circumference region 22. Therefore, the electrode fingers are bended in the connection fingers 18a and 18b.

A velocity of an acoustic wave in the acoustic wave device of the first embodiment was simulated with the following conditions.
Piezoelectric substrate: 42 degrees rotated Y-cut X propagation LitaO$_3$ substrate
Material of metal film: Aluminum film
Duty ratio of IDT: 0.5
Duty ratio of grating: 0.6
Pitch of electrode finger of grating: $\lambda 2 = 0.9968 \times \lambda 1$
A width of the gap region 24 in the aperture direction is, for example, $\lambda 1$ or less and is sufficiently smaller than twenty times of a width of the IDT region 20 in the aperture direction X $\lambda 1$. Therefore, the gap region 24 can be ignored. The same shall apply hereafter.

Figure 7:
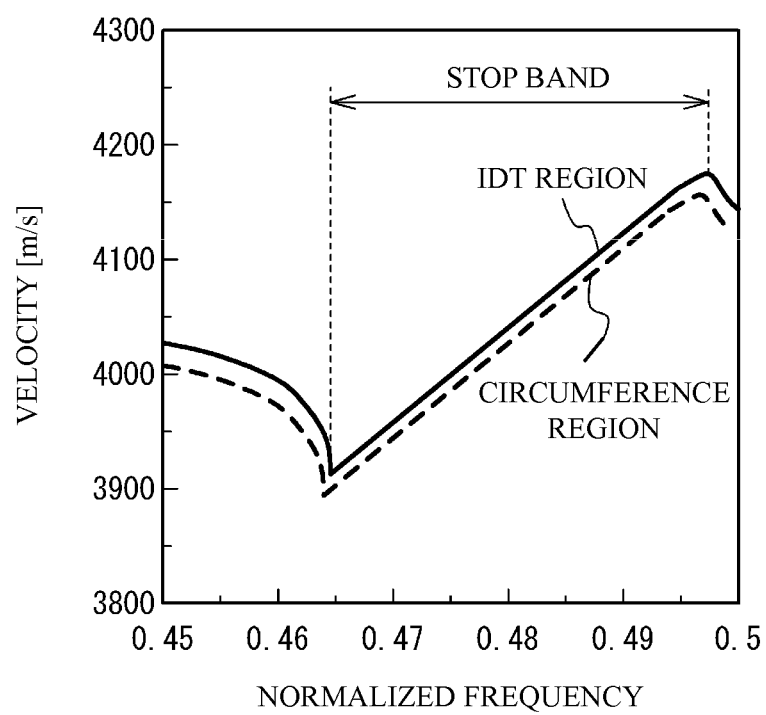
FIG. 7 illustrates a velocity of an acoustic wave with respect to a normalized frequency in an acoustic wave device of a first embodiment.

FIG. 7 illustrates a velocity of an acoustic wave with respect to a normalized frequency in the acoustic wave device of the first embodiment. A solid line and a broken line respectively indicate the simulation results of the velocity of the acoustic wave in the IDT region 20 and the circumference region 22. As illustrated in FIG. 7, in an entire frequency range including the stop band, the velocity of the acoustic wave of the circumference region 22 is smaller than that of the IDT region 20. In the first embodiment, the duty ratio of the electrode finger 16a through the electrode finger 17b in the circumference region 22 is larger than that of the IDT region 20. Therefore, as in the case of the second comparative example of FIG. 5, the acoustic wave of the circumference region 22 in a frequency band out of the stop band is delayed. Moreover, the pitch of the electrode finger 16a through the electrode finger 17b in the circumference region 22 is smaller than that of the IDT region 20. Therefore, the velocity characteristics can be shifted to the high frequency side. Thus, the leakage of the energy of the acoustic wave to the circumference region 22 can be suppressed.

Figure 8:
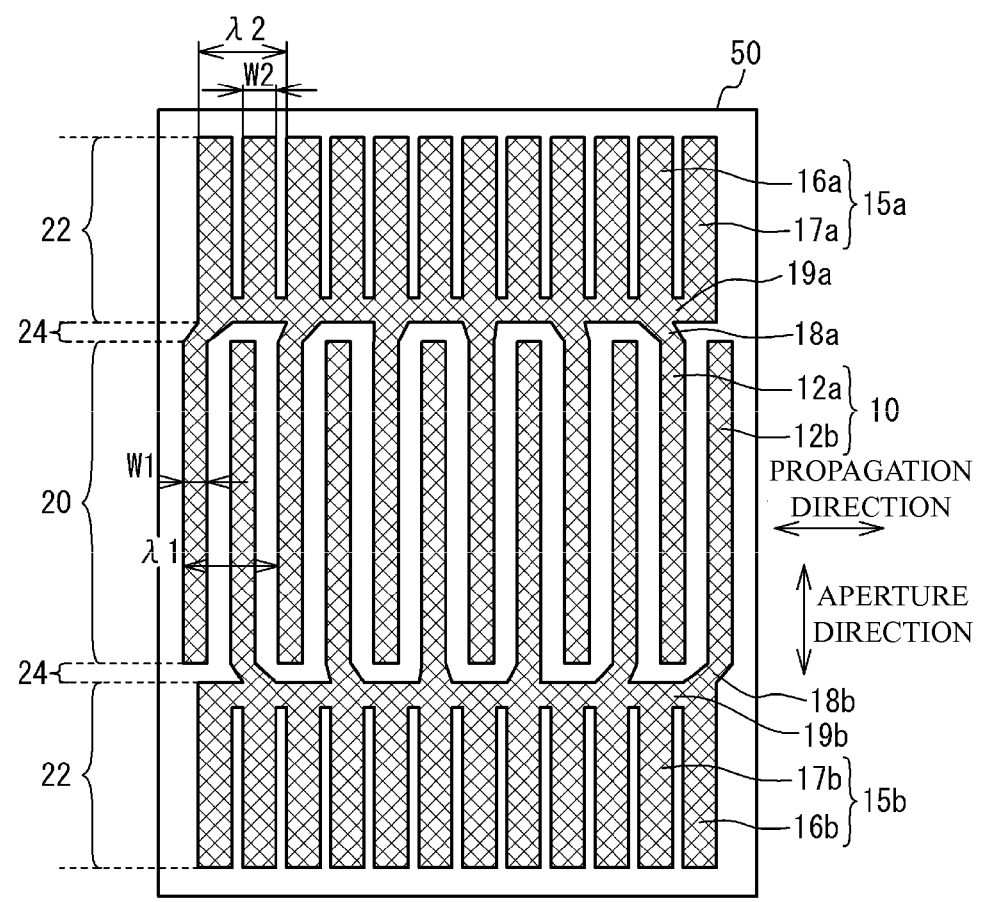
FIG. 8 illustrates a plane view of an acoustic wave device in accordance with a first modified embodiment of a first embodiment.

FIG. 8 illustrates a plane view of an acoustic wave device in accordance with a first modified embodiment of the first embodiment. As illustrated in FIG. 8, there may be provided a connection line 19a that connects the electrode fingers 16a and 17a of the circumference region 22 and a connection line 19b that connects the electrode fingers 16b and 17b between the IDT region 20 and the circumference region 22. In this case, it is not necessary for the connection fingers 18a and 18b to be bended. When the width of the connection lines 19a and 19b in the aperture direction is $\lambda 1$ or less, influences of the connection lines 19a and 19b can be substantially ignored. Other structures are the same as the first embodiment. Therefore, an explanation of the structures is omitted.

Figure 9:
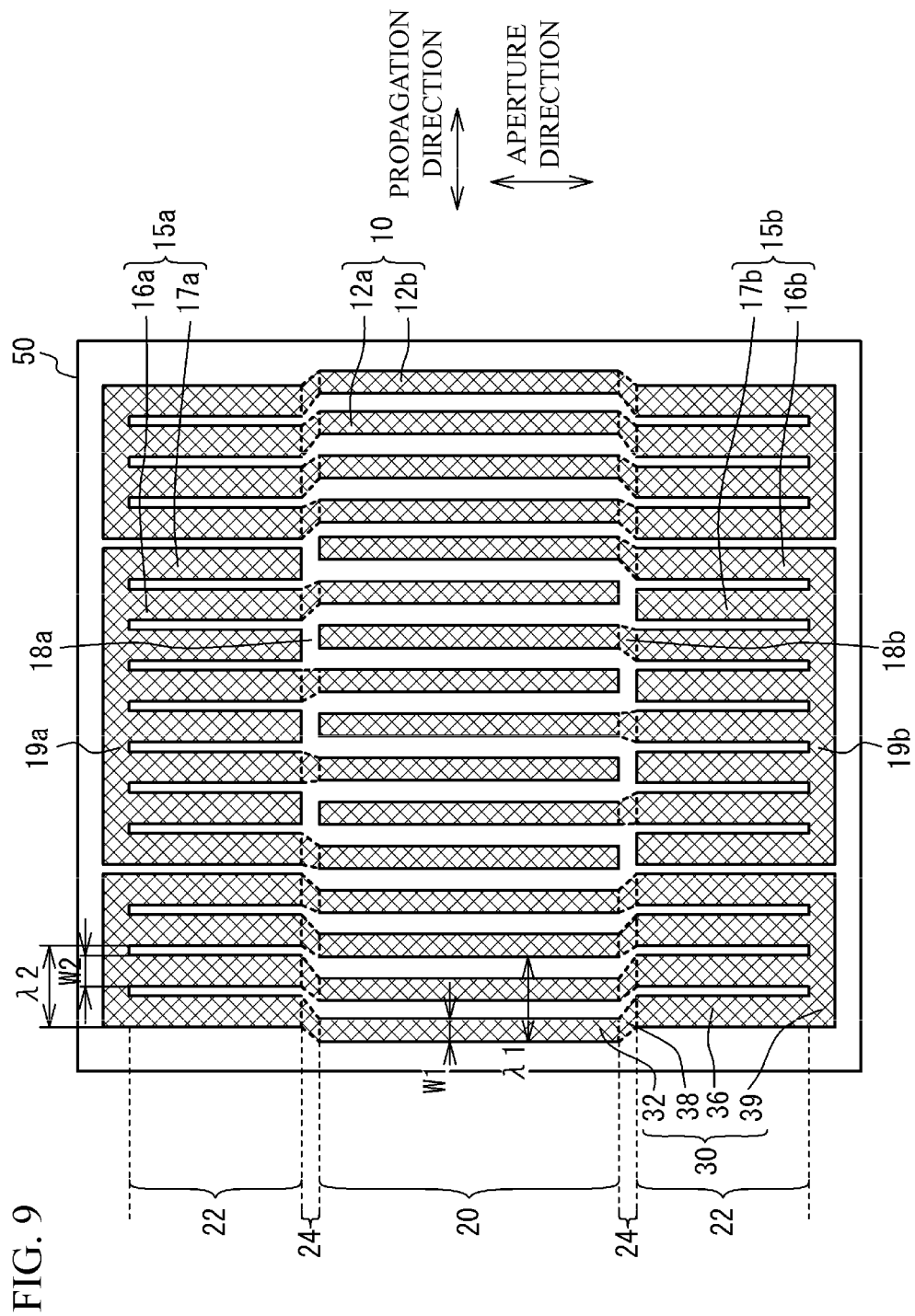
FIG. 9 illustrates a plane view of an acoustic wave device in accordance with a second modified embodiment of a first embodiment.

FIG. 9 illustrates a plane view of an acoustic wave device in accordance with a second modified embodiment of the first embodiment. As illustrated in FIG. 9, there may be provided the connection line 19a that connects the electrode fingers 16a and 17a of the circumference region 22 and the connection line 19b that connects the electrode fingers 16b and 17b of the circumference region 22, outside of the circumference region 22 in the aperture direction. In this case, when the width of the connection lines 19a and 19b in the aperture direction is $\lambda 1$ or less, the influences of the connection lines 19a and 19b can be substantially ignored. The connection lines 19a and 19b may be provided near a center of the circumference region 22 in the aperture direction.

Reflectors 30 are provided on the both sides of the IDT 10 in the propagation direction. The reflectors 30 have electrode fingers 32, electrode fingers 36, connection fingers 38 and connection lines 39. The electrode fingers 32 are provided in the IDT region 20. The electrode fingers 36 are provided in the circumference region 22. The connection fingers 38 are provided in the gap region 24 and connects the electrode fingers 32 and the electrode fingers 36. The connection lines 39 connect the electrode fingers 36. In the reflectors 30, the width W2 of the electrode fingers 36 in the circumference region 22 in the propagation direction is larger than the width W1 of the electrode fingers 32 in the IDT region 20 in the propagation direction. The duty ratio $2 \times W2/\lambda 2$ of the electrode finger 36 in the circumference region 22 in the propagation direction is smaller than the duty ratio $2 \times W1/\lambda 1$. Other structures are the same as the first embodiment. Therefore, an explanation of the structures is omitted. The reflectors may be provided in the first embodiment and the modified embodiments of the first embodiment.

Figure 10:
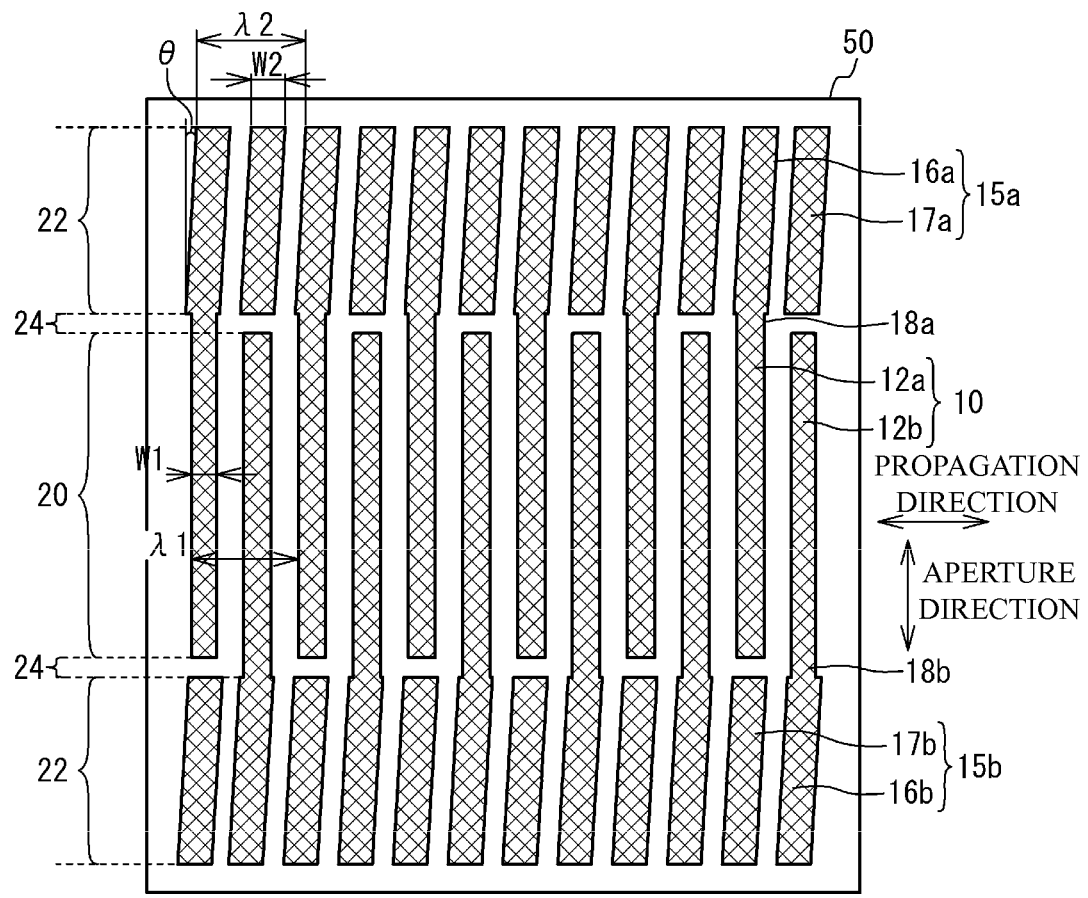
FIG. 10 illustrates a plane view of an acoustic wave device in accordance with a third modified embodiment of a first embodiment.

FIG. 10 illustrates a plane view of an acoustic wave device in accordance with a third modified embodiment of the first embodiment. As illustrated in FIG. 10, a pitch $\lambda 2$ of the electrode fingers 16a and 17a of the grating 15a, another pitch $\lambda 2$ of the electrode fingers 16b and 17b of the grating 15b, and a pitch $\lambda 1$ of the electrode fingers 12a and 12b of the IDT 10 are the same as each other. The electrode fingers 16a to 17b of the gratings 15a and 15b are inclined with respect to the aperture direction by an angle $\theta$. Other structures are the same as the first embodiment. Therefore, an explanation of the structures is omitted. Thus, when the electrode fingers 16a to 17b are inclined with respect to the aperture direction, a resonant frequency of the gratings 15a and 15b can be shifted to a high frequency side.

Figure 11:
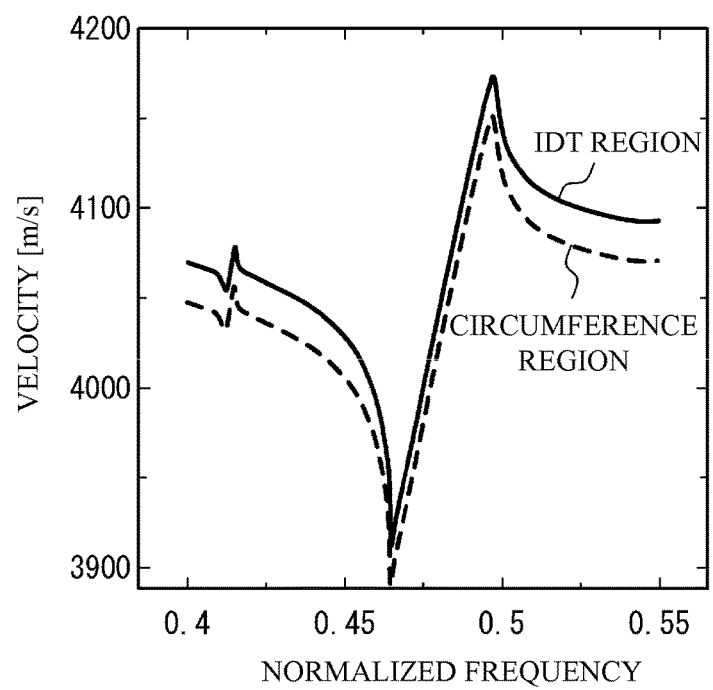
FIG. 11 illustrates a velocity of an acoustic wave in an acoustic wave device of a first embodiment with respect to a normalized frequency.

A velocity of an acoustic wave in the acoustic wave device of the third modified embodiment of the first embodiment was simulated with the following conditions.
Piezoelectric substrate: 42 degrees rotated Y-cut propagation LiTaO$_3$ substrate
Material of metal film: an aluminum film
Duty ratio of IDT: 0.5
Duty ratio of grating: 0.6
Pitch of electrode fingers of grating: $\lambda 2 = \lambda 1$
Angle $\theta$ of electrode fingers of grating: 5 degrees FIG. 11 illustrates a velocity of an acoustic wave in the acoustic wave device of the first embodiment with respect to a normalized frequency. A solid line indicates the simulation result of the velocity of the acoustic wave in the IDT region 20. A broken line indicates the simulation result of the velocity of the acoustic wave in the circumference region 22. As illustrated in FIG. 11, the velocity of the acoustic wave in the circumference region 22 is smaller than that of the IDT region 20 in an entire frequency range including the stop band. Thus, the leakage of the energy of the acoustic wave to the circumference region 22 can be suppressed.

Figure 12:
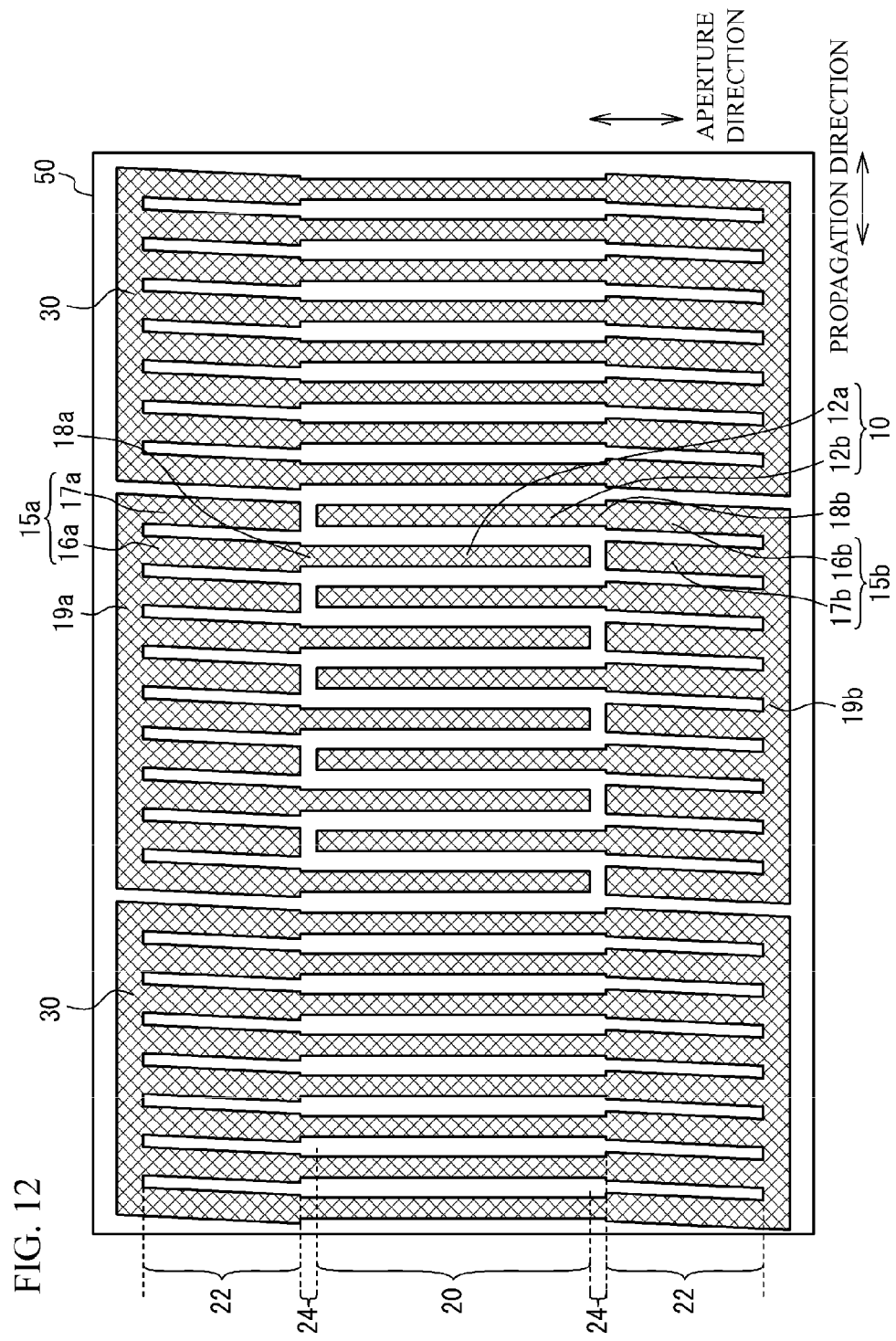
FIG. 12 illustrates a plane view of an acoustic wave device in accordance with a fourth modified embodiment of a first embodiment.

In a fourth modified embodiment of the first embodiment, a resonator is fabricated. FIG. 12 illustrates a plane view of an acoustic wave device in accordance with the fourth modified embodiment of the first embodiment. As illustrated in FIG. 12, the pitch of the electrode fingers 16a to 17b of the circumference region 22 is the same as that of the IDT region 20. In the IDT 10 and the reflector 30, the electrode fingers 16a to 17b of the circumference region 22 are inclined with respect to the aperture direction. Other structures are the same as the second modified embodiment of the first embodiment. Therefore, an explanation of the structures is omitted.

The fabrication conditions of the fourth modified embodiment of the first embodiment are as follows.
Piezoelectric substrate: 42 degrees rotated Y-cut X-propagation LiTaO$_3$ substrate
Material of metal film: aluminum film
Thickness of metal film: 0.09×λ1 (constant)
Duty ratio of IDT: 0.5
Duty ratio of grating: 0.6
Pitch of electrode fingers of grating: λ2=λ1=2 μm
Angle θ of electrode fingers of grating: 5 degrees
The duty ratio, the pitch and the angle of the electrode fingers of the IDT region 20 and the circumference region 22 in the reflector 30 are the same as those of the IDT 10.

Figure 13:
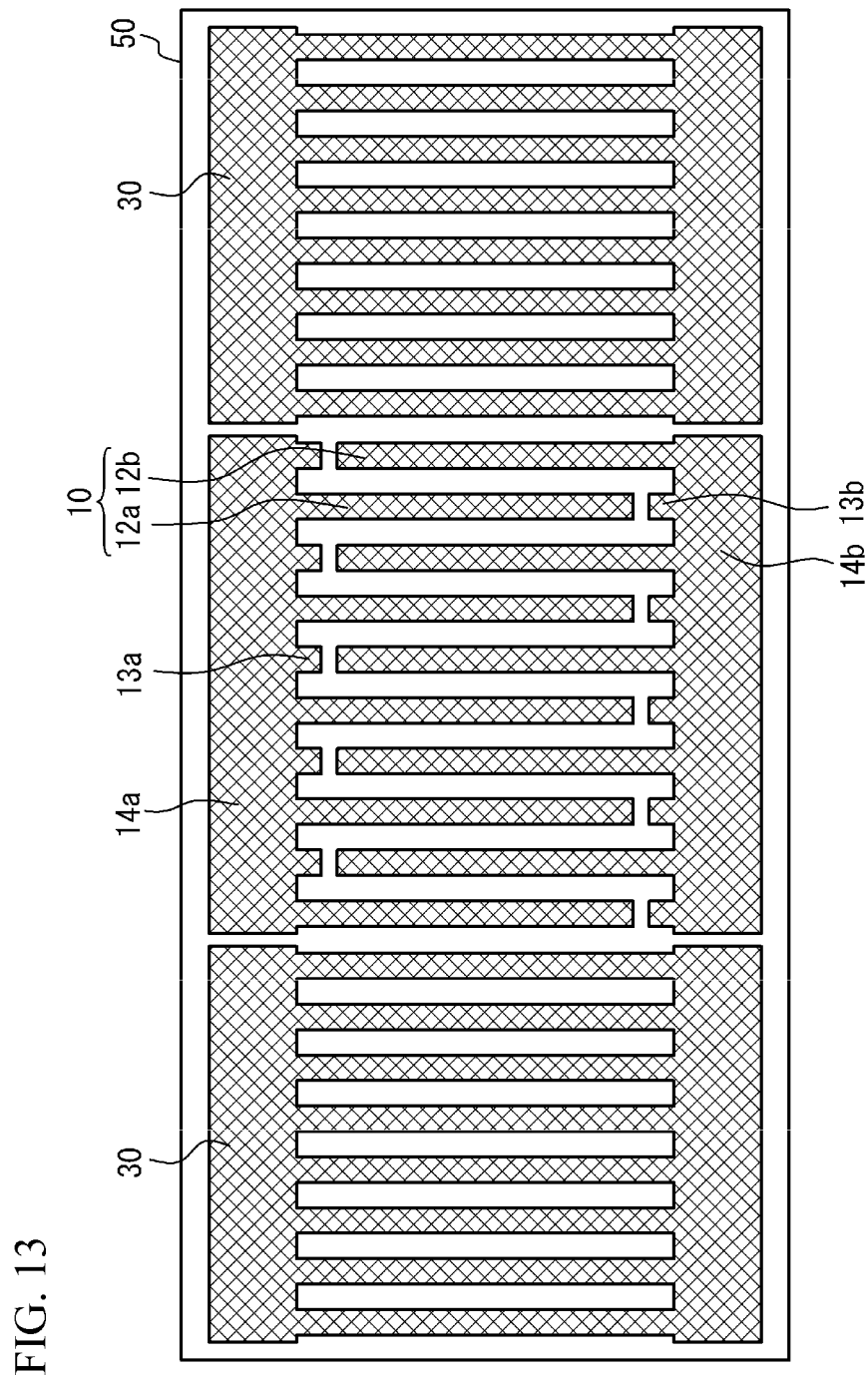
FIG. 13 illustrates a plane view of an acoustic wave device of a third comparative example.

FIG. 13 illustrates a plane view of an acoustic wave device of a third comparative example. As illustrated in FIG. 13, in the third comparative example, no gratings are formed. The bus bars 14a and 14b and dummy electrodes 13a and 13b are provided. The duty ratio and the pitch of the electrode fingers 12a and 12b of the IDT 10 are the same as those of the fourth modified embodiment of the first embodiment.

Figure 14:
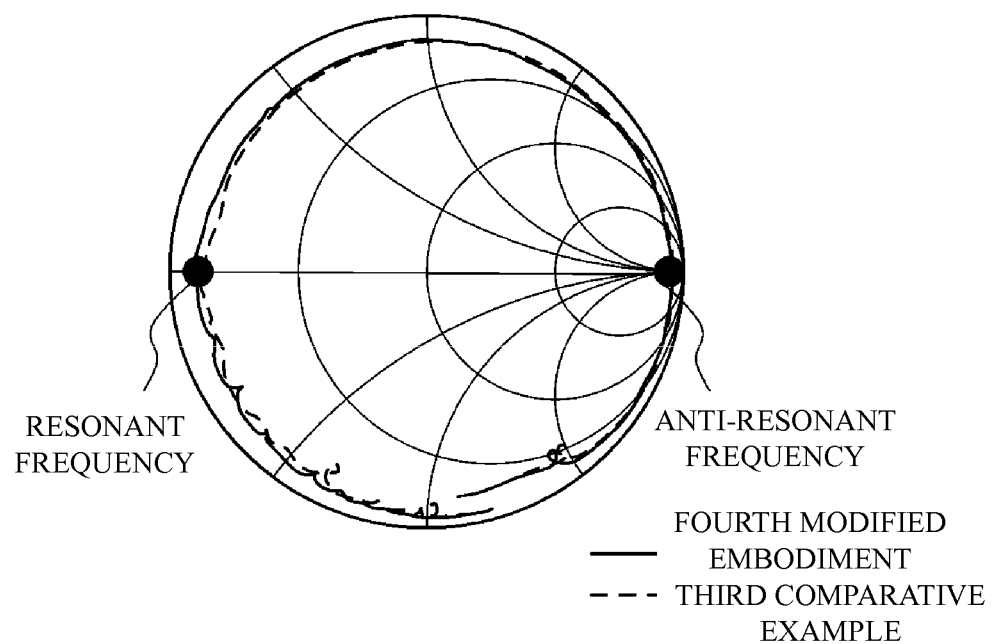
FIG. 14 illustrates a smith chart indicating reflection characteristics (S11) of resonators of a fourth modified embodiment of a first embodiment and a third comparative example.

FIG. 14 illustrates a smith chart indicating reflection characteristics (S11) of the resonators of the fourth modified embodiment of the first embodiment and the third comparative example. As illustrated in FIG. 14, the S11 of the fourth modified embodiment of the first embodiment is closer to an outer circumference of the smith chart than that of the third comparative example, near the resonant frequency. This indicates that the insertion loss of the fourth modified embodiment of the first embodiment is smaller than that of the third comparative example.

In the first embodiment and the modified embodiments of the first embodiment, when the slowness surface in the main propagation direction of the acoustic wave is the concave type, the duty ratio of the electrode fingers 16a to 17b of the gratings 15a and 15b is larger than the duty ratio of the electrode fingers 12a and 12b in the IDT 10. Thus, as in the case of the second comparative example of FIG. 5, the velocity of the acoustic wave outside of the stop band is reduced. In this case, the resonant frequency 66b of the gratings 15a and 15b is shifted to a low frequency side with respect to the resonant frequency 66a of the IDT 10. And so, the pitch of the electrode fingers 16a to 17b of the gratings 15a and 15b is smaller than the pitch of the electrode fingers 12a and 12b of the IDT 10. Thus, as illustrated in FIG. 5, the resonant frequency of the gratings 15a and 15b can be shifted to the high frequency side from the resonant frequency 66b to the resonant frequency 66c. Thus, in the stop band, the velocity of the acoustic wave of the circumference region 22 can be smaller than that of the IDT region 20. It is therefore possible to suppress the leakage of the acoustic wave to the circumference region 22.

When the resonant frequency 66c is largely different from the resonant frequency 66a, a frequency band where the velocity of the acoustic wave in the circumference region 22 is larger than that of the IDT region 20 may appear. And so, it is preferable that the resonant frequency 66c of the gratings 15a and 15b is substantially consistent with the resonant frequency 66a of the IDT 10. The substantial consistence of resonant frequencies means that the resonant frequency 66c is consistent with the resonant frequency 66a such that the velocity of the acoustic wave in the circumference region 22 is smaller than that of the IDT region 20 in the stop band and other bands. In order to achieve the resonant frequency 66c, it is preferable that the pitch λ2 of the electrode fingers 16a to 17b of the circumference region 22 is smaller than the pitch λ1 of the electrode fingers 12a and 12b of the IDT region 20 and equals to 0.9 times of the pitch λ1 or more. It is more preferable that the pitch λ2 is smaller than the pitch λ1 and equals to 0.95 times of the pitch λ1 or more. It is more preferable that the pitch λ2 is smaller than the pitch λ1 and equals to 0.98 times of the pitch λ1 or more.

In order to make a difference between the pitch λ2 and the pitch λ1 such that the resonant frequency 66c is substantially consistent with the resonant frequency 66a, the electrode fingers 16a to 17b of the circumference region 22 are bended at the connection fingers 18a and 18b and are connected to the electrode fingers 12a and 12b of the IDT region 20.

Moreover, in order to the shift the resonant frequency 66b to the resonant frequency 66c, the electrode fingers 16a to 17b of the gratings 15a and 15b may be inclined with respect to the aperture direction as in the case of the third modified embodiment of the first embodiment.

Figure 15:
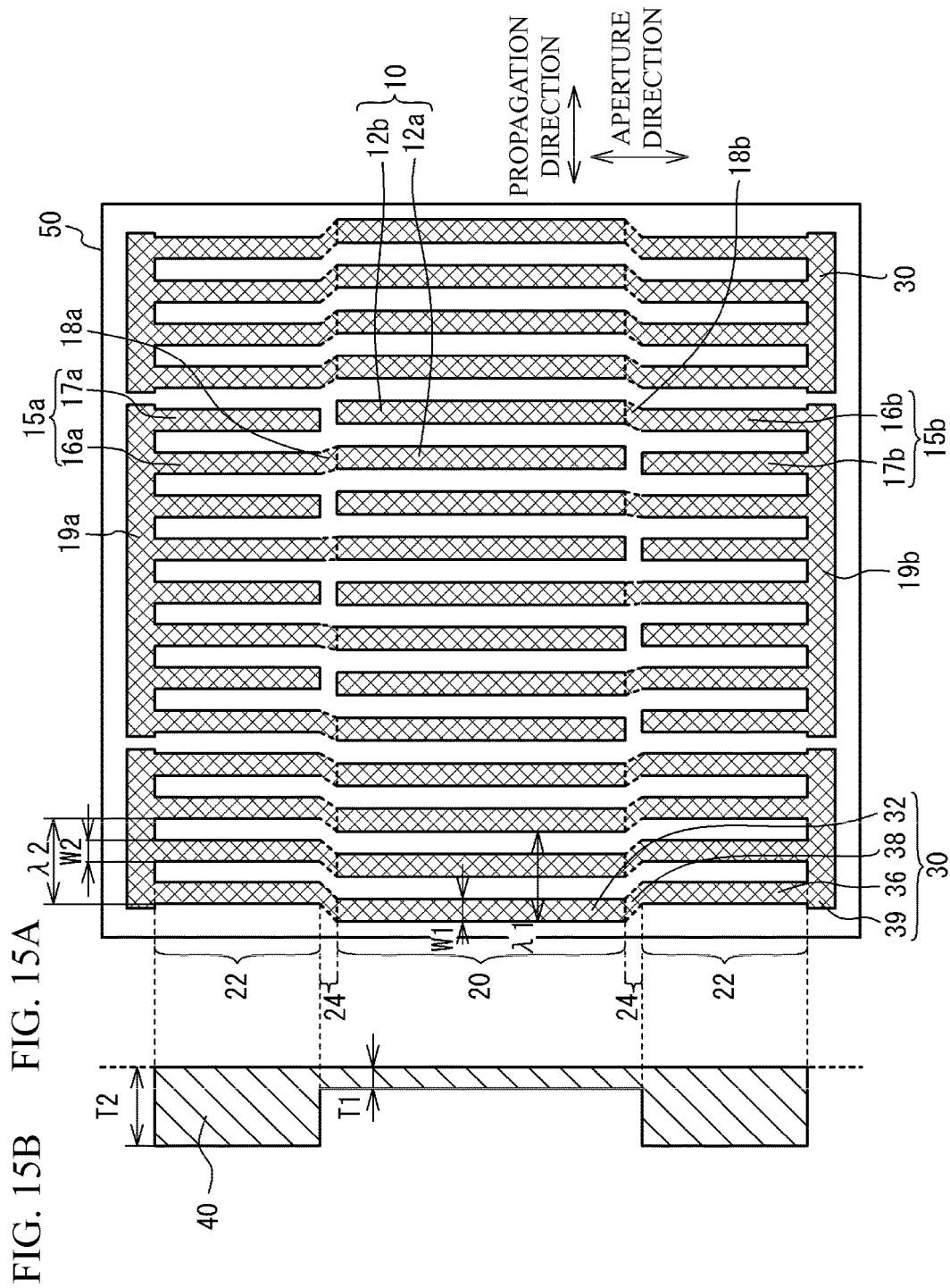
FIG. 15A illustrates a plane view of an acoustic wave device in accordance with a fifth modified embodiment of a first embodiment.
FIG. 15B illustrates a cross sectional view of electrode fingers.

FIG. 15A illustrates a plane view of an acoustic wave device in accordance with a fifth modified embodiment of the first embodiment. FIG. 15B illustrates a cross sectional view of electrode fingers. As illustrated in FIG. 15A and FIG. 15B, a thickness T2 of a metal film 40 forming the electrode fingers 16a to 17b in the circumference region 22 is larger than a thickness T1 of another metal film 40 forming the electrode fingers 12a and 12b of the IDT region 20. The duty ratio of the electrode fingers 16a to 17b of the circumference region 22 is the same as the duty ratio of the electrode fingers 12a and 12b of the IDT region 20. The pitch of the electrode fingers 16a to 17b of the circumference region 22 is smaller than that of the electrode fingers 12a and 12b of the IDT region 20. Other structures are the same as FIG. 9 of the second modified embodiment of the first embodiment. Therefore, an explanation of the structures is omitted.

In the fifth modified embodiment of the first embodiment, the thickness T2 of the electrode fingers 16a to 17b of the gratings 15a and 15b is larger than the thickness T1 of the electrode fingers 12a and 12b of the IDT. Thus, with a mass-loading effect, the velocity of the acoustic wave of the circumference region 22 can be smaller than that of the IDT region 20. Thus, a relationship between a frequency and a velocity can be achieved as well as FIG. 4.

Figure 16:
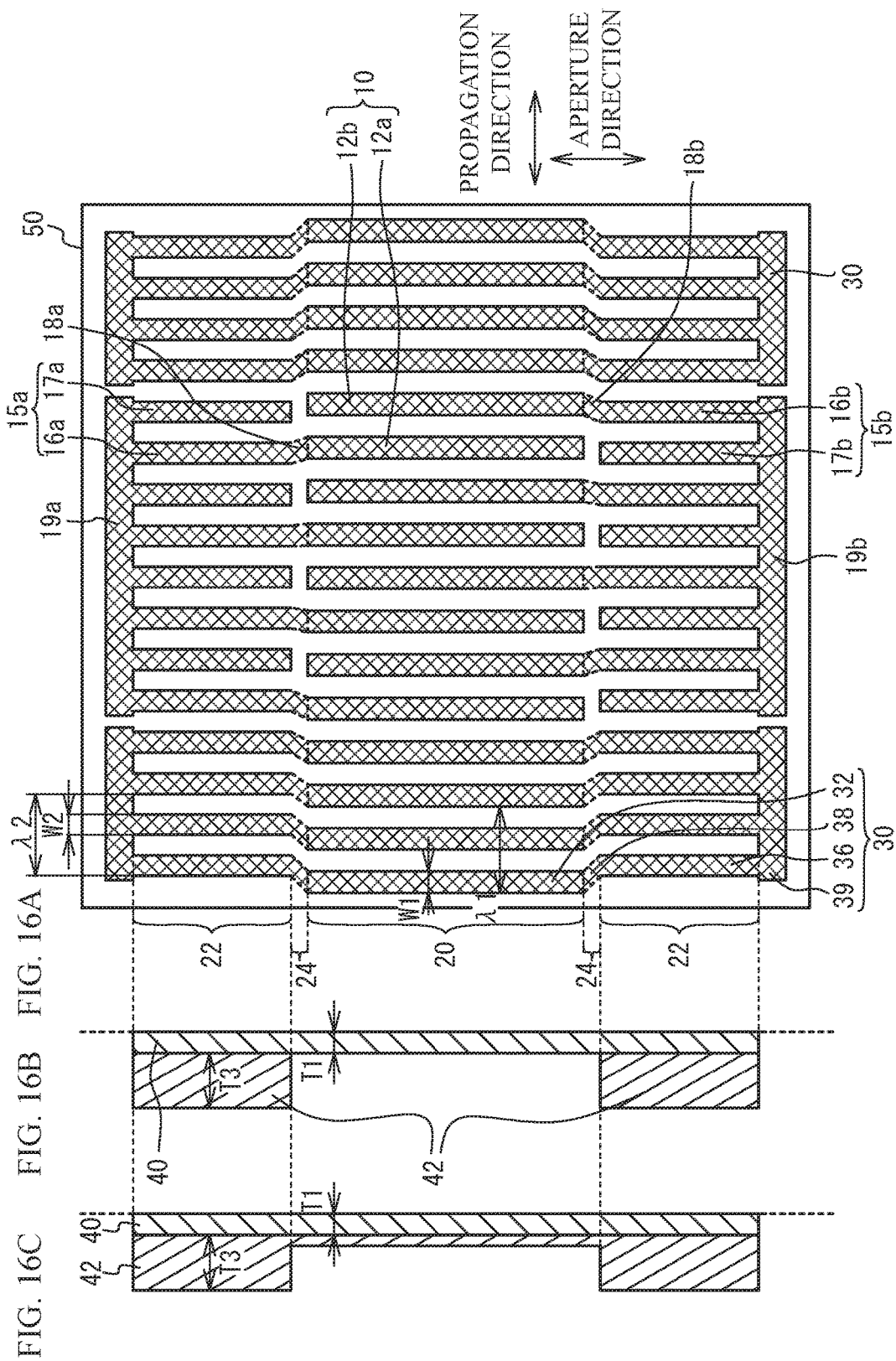
FIG. 16A illustrates a plane view of an acoustic wave device of a sixth modified embodiment of a first embodiment.
FIG. 16B and FIG. 16C illustrate cross sectional views of electrode fingers.

FIG. 16A illustrates a plane view of an acoustic wave device of a sixth modified embodiment of the first embodiment. FIG. 16B illustrates a cross sectional view of electrode fingers. As illustrated in FIG. 16A and FIG. 16B, the thickness T1 of the metal film 40 of the circumference region 22 is the same as the thickness Ta of the metal film 40 of the IDT region 20. In the circumference region 22, an added film 42 having a thickness T3 is added on the metal film 40. The added film 42 may be a metal film such as an aluminum film, a copper film or a gold film, or a dielectric film such as a silicon oxide film, a silicon nitride film or a silicon oxynitride film. The duty ratio of the electrode fingers 16a to 17b of the circumference region 22 is the same as the duty ratio of the electrode fingers 12a and 12b of the IDT region 20. The pitch of the electrode fingers 16a to 17b of the circumference region 22 is smaller than that of the electrode fingers 12a and 12b of the IDT region 20. Other structures are the same as FIG. 15A and FIG. 15B of the fifth modified embodiment of the first embodiment. Therefore, an explanation of the structures is omitted.

In the sixth modified embodiment of the first embodiment, as shown in FIG. 16C, the thickness T3 of the added film 42 provided on the electrode fingers 16a to 17b of the gratings 15a and 15b is larger than the thickness of the added film 42 provided on the electrode fingers 12a and 12b of the IDT 10. Thus, the velocity of the acoustic wave of the circumference region 22 can be smaller than that of the IDT region 20. Thus, with the mass-loading effect, the velocity of the acoustic wave in the circumference region 22 can be smaller than that of the IDT region 20. It is therefore possible to achieve the relationship between the frequency and the velocity as well as FIG. 4. As illustrated in FIG. 16B, the IDT region 20 may lack of an added film.

In the first modified embodiment to the fourth modified embodiment of the first embodiment, the thickness of the electrode fingers 16a to 17b may be larger than that of the electrode fingers 12a and 12b as in the case of the fifth modified embodiment of the first embodiment instead that the duty ratio of the electrode fingers 16a to 17b is larger than that of the electrode fingers 12a and 12b. As in the case of the sixth modified embodiment of the first embodiment, the thickness of the added film 42 provided on the electrode fingers 16a to 17b may be larger than that of the added film provided on the electrode fingers 12a and 12b.

Second Embodiment

Figure 17:
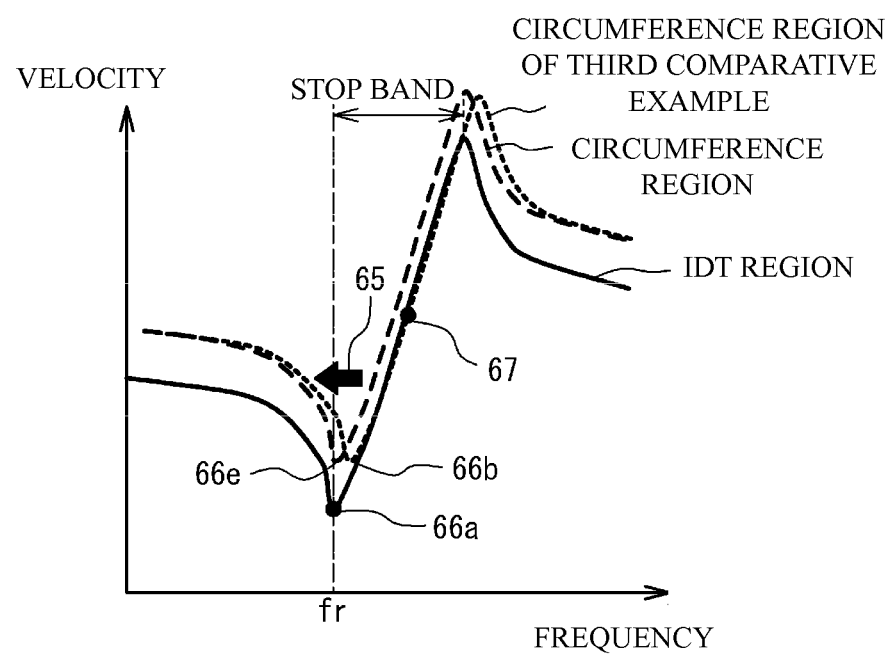
FIG. 17 illustrates a velocity of an acoustic wave with respect to a frequency in a second embodiment.

A second embodiment is an example of the convex type. FIG. 17 illustrates a velocity of an acoustic wave with respect to a frequency in the second embodiment. A solid line indicates the velocity of the acoustic wave with respect to the frequency in the IDT region 20. In the convex type, the duty ratio of the electrode fingers 16a to 17b of the circumference region 22 is smaller than the duty ratio of the electrode fingers 12a and 12b of the IDT region 20. Thus, as indicated by a dotted line (third comparative example) of FIG. 17, the velocity of the acoustic wave of the circumference region 22 outside of the stop band can be larger than that of the IDT region 20.

However, in the third comparative example, the velocity of the acoustic wave of the circumference region 22 is substantially the same as that of the IDT region 20, in the stop band. And so, as indicated by an arrow 65, the resonant frequency 66b of the electrode fingers 16a to 17b of the circumference region 22 is shifted to a resonant frequency 66e toward the low frequency side. Thus, in the stop band and outside of the stop band, the velocity of the acoustic wave of the circumference region 22 can be larger than that of the IDT region 20. It is therefore possible to suppress the leakage of the energy of the acoustic wave to the circumference region 22.

Figure 18A:
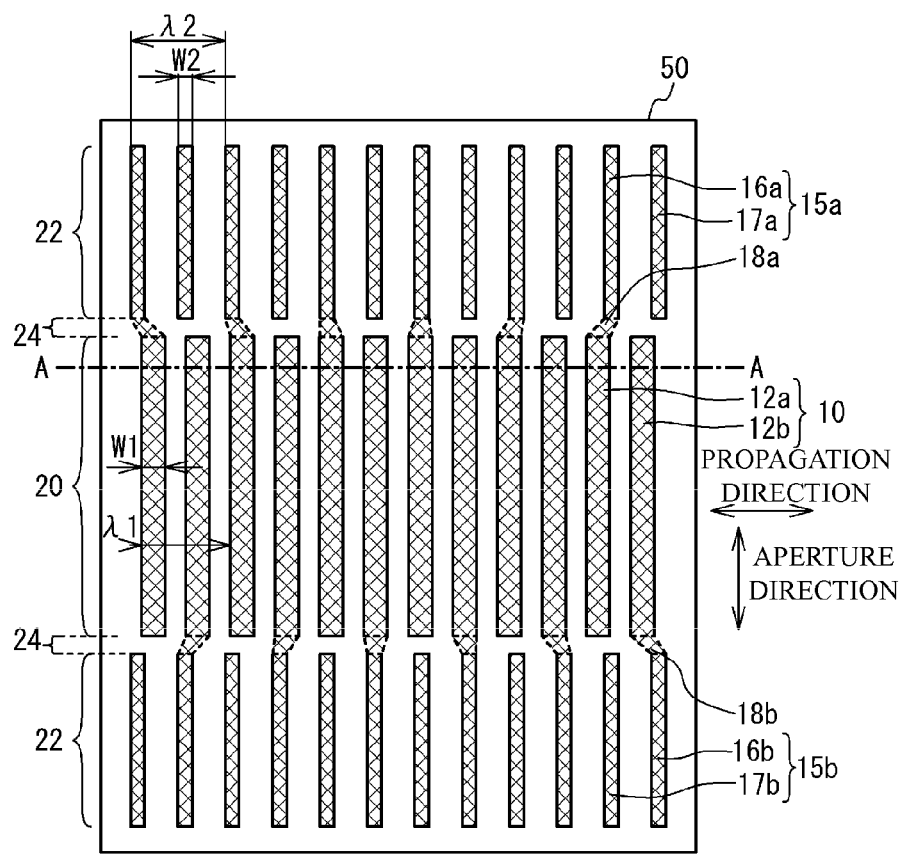
FIG. 18A illustrates a plane view of an acoustic wave device in accordance with a second embodiment.
Figure 18B:
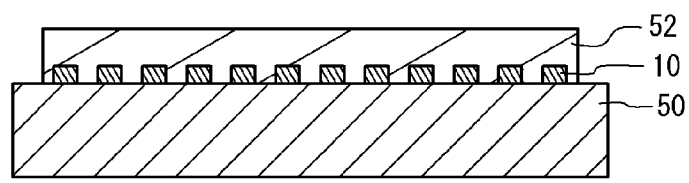
FIG. 18B illustrates a cross sectional view taken along a line A-A of FIG. 18A.

FIG. 18A illustrates a plane view of an acoustic wave device in accordance with the second embodiment. FIG. 18B illustrates a cross sectional view taken along a line A-A of FIG. 18A. As illustrated in FIG. 18A, the duty ratio of the electrode fingers 16a to 17b of the circumference region 22 is smaller than that of the electrode fingers 12a and 12b of the IDT region 20. Thus, as in the case of the third comparative example of FIG. 17, the velocity of the acoustic wave of the circumference region 22 outside of the stop band can be larger than that of the IDT region 20. Moreover, the pitch of the electrode fingers 16a to 17b of the circumference region 22 is larger than the pitch of the electrode fingers 12a and 12b of the IDT region 20. Thus, as indicated by the arrow 65 of FIG. 17, the velocity characteristics can be shifted to the low frequency side. Therefore, the velocity of the acoustic wave of the circumference region 22 can be larger than that of the IDT region 20 in the stop band and outside of the stop band. Other structures are the same as FIG. 6 of the first embodiment. Therefore, an explanation of the structures is omitted.

As illustrated in FIG. 18B, the IDT 10 is formed on the piezoelectric substrate 50. A temperature compensation film 52 is formed on the IDT 10. The piezoelectric substrate 50 is, for example, a rotated Y-cut $LiNbO_3$ substrate. A cut angle of the piezoelectric substrate 50 is near 0 degree or near 128 degrees. The temperature compensation film 52 is a silicon oxide film or the like. In this manner, the acoustic wave may be an acoustic wave using a love wave or a Rayleigh wave. The acoustic wave device may lack of the temperature compensation film.

In the second embodiment, the pitch of the electrode fingers 16a to 17b of the circumference region 22 is larger than the pitch of the electrode fingers 12a and 12b of the IDT region 20. Thus, the velocity of the acoustic wave in the circumference region 22 in the stop band and outside of the stop band can be larger than that of the IDT region 20 as illustrated in FIG. 17. It is therefore possible to suppress the leakage of the energy of the acoustic wave to the circumference region 22.

It is preferable that the resonant frequency 66a of the gratings 15a and 15b is substantially consistent with the resonant frequency 66e of the IDT 10. The substantial consistence of the resonant frequency 66a and 66e means that the resonant frequency 66e and the resonant frequency 66a are consistent with each other such that the velocity of the acoustic wave of the circumference region 22 is larger than that of the IDT region 20 in the stop band and other bands. In order to achieve the resonant frequency 66e, the pitch λ2 of the electrode fingers 16a to 17b of the circumference region 22 is larger than the pitch λ1 of the electrode fingers of the IDT region 20 and equals to 1.1 times of the pitch λ1 or less. It is more preferable that the pitch λ2 is larger than the pitch λ1 and equals to 1.05 times of the pitch λ2 or less. It is much more preferable that the pitch λ1 is larger than the pitch λ1 and equals to 1.02 times of the pitch λ1 or less.

In order to make difference between the pitch λ1 and the pitch λ2 such that the resonant frequency 66e is approximately consistent with the resonant frequency 66a, it is preferable that the electrode fingers 16a and 16b of the circumference region 22 are bended at the connection fingers 18a and 18b and are respectively connected to the electrode fingers 12a and 12b via the connection fingers 18a and 18b.

Figure 19A:
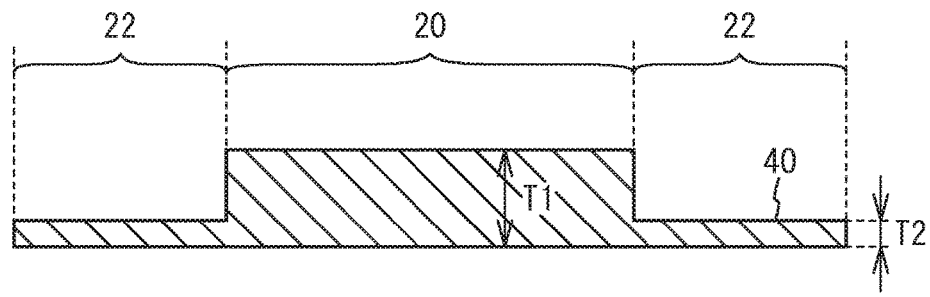
FIG. 19A to FIG. 19C respectively illustrate cross sectional views of acoustic wave devices of a first modified embodiment and a second modified embodiment of a second embodiment.
Figure 19B:
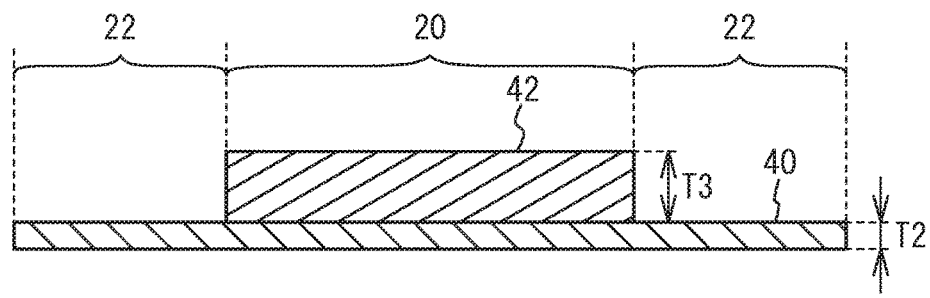

FIG. 19A and FIG. 19B respectively illustrate cross sectional views of the acoustic wave devices of the first modified embodiment and the second modified embodiment of the second embodiment. As illustrated in FIG. 19A, the thickness T2 of the metal film 40 forming the electrode fingers 16a to 17b of the circumference region 22 is smaller than the thickness T1 of the metal film 40 forming the electrode fingers 12a and 12b of the IDT region 20. The duty ratio of the electrode fingers 16a to 17b of the circumference region 22 is the same as the duty ratio of the electrode fingers 12a and 12b of the IDT region 20. The pitch of the electrode fingers 16a to 17b of the circumference region 22 is larger than the pitch of the electrode fingers 12a and 12b of the IDT region 20. Other structures are the same as the second embodiment. Therefore, an explanation of the structures is omitted.

In the first modified embodiment of the second embodiment, the thickness T2 of the electrode fingers 16a to 17b of the gratings 15a and 15b is smaller than the thickness T1 of the electrode fingers 12a and 12b of the IDT. Thus, with the mass-loading effect, the velocity of the acoustic wave of the circumference region 22 can be larger than that of the IDT region 20.

As illustrated in FIG. 19B, the thickness T1 is identical in the metal film 40 of the circumference region 22 and the metal film 40 of the IDT region 20. In the IDT region 20, the added film 42 having the thickness T3 is added on the metal film 40. The example of the material of the added film 42 is the same as the sixth modified embodiment of the first embodiment. The duty ratio of the electrode fingers 16a to 17b of the circumference region 22 is the same as the duty ratio of the electrode fingers 12a and 12b of the IDT region 20. The pitch of the electrode fingers 16a to 17b of the circumference region 22 is larger than the pitch of the electrode fingers 12a and 12b of the IDT region 20. Other structures are the same as the second embodiment. Therefore, an explanation of the structures is omitted.

Figure 19C:
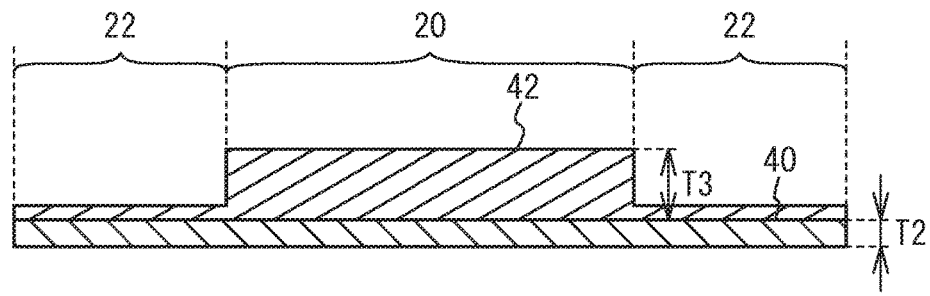

In the second modified embodiment of the second embodiment, as shown in FIG. 19C, the thickness T3 of the added film 42 provided on the electrode fingers 16a to 17b of the gratings 15a and 15b is smaller than the thickness of the added film 42 provided on the electrode fingers 12a and 12b of the IDT. Thus, the velocity of the acoustic wave of the circumference region 22 can be larger than that of the IDT region 20. As in the case of FIG. 19B, the circumference region 22 may lack of an added film.

In this manner, the thickness of the electrode fingers 16a to 17b of the circumference region 22 may be smaller than the thickness of the electrode fingers 12a and 12b of the IDT region 20 instead that the duty ratio of the electrode fingers 16a to 17b of the circumference region 22 is smaller than the duty ratio of the electrode fingers 12a and 12b of the IDT region 20. Alternately, the thickness T3 of the added film 42 provided on the electrode fingers 16a to 17b of the circumference region 22 may be smaller than the thickness of the added film provided on the electrode finger 12a and 12b of the IDT region 20.

At least one of the connection lines 19a and 16b described in the first embodiment and the modified embodiments of the first embodiment may be used in the second embodiment and the modified embodiments of the second embodiment. The reflector 30 described in the first embodiment and the modified embodiments of the first embodiment may be used in the second embodiment.

The present invention is not limited to the specifically described embodiments, but other embodiments and variations may be made without departing from the scope of the claimed invention.

What is claimed is:

1. An acoustic wave device comprising:
   a piezoelectric substrate that is a rotated Y-cut LiTaO$_3$ substrate;
   an Interdigital Transducer (IDT) that is provided on the piezoelectric substrate and excites an acoustic wave; and
   gratings that are provided on both sides of the IDT in an aperture direction thereof,
   wherein:
   a duty ratio of electrode fingers of the gratings is larger than a duty ratio of the electrode fingers of the IDT, or a thickness of the electrode fingers of the gratings is larger than a thickness of the electrode fingers of the IDT, or a thickness of an added film provided on the electrode fingers of the gratings is larger than a thickness of an added film provided on the electrode fingers of the IDT;
   a pitch of the electrode fingers of the gratings is smaller than a pitch of the electrode fingers of the IDT; and
   a resonant frequency of the gratings is substantially the same as a resonant frequency of the IDT.

2. An acoustic wave device comprising:
   a piezoelectric substrate that is a rotated Y-cut LiTaO$_3$ substrate;
   an IDT that is provided on the piezoelectric substrate and excites an acoustic wave; and
   gratings that are provided on both sides of the IDT in an aperture direction thereof,
   wherein:
   a duty ratio of electrode fingers of the gratings is larger than a duty ratio of the electrode fingers of the IDT, or a thickness of the electrode fingers of the gratings is larger than a thickness of the electrode fingers of the IDT, or a thickness of an added film provided on the electrode fingers of the gratings is larger than a thickness of an added film provided on the electrode fingers of the IDT;
   a pitch of the electrode fingers of the gratings is smaller than a pitch of the electrode fingers of the IDT; and
   the electrode fingers of the gratings and the electrode fingers of the IDT are connected to each other via bended regions.

3. An acoustic wave device comprising:
   a piezoelectric substrate that is a rotated Y-cut LiTaO$_3$ substrate;
   an IDT that is provided on the piezoelectric substrate and excites an acoustic wave; and
   gratings that are provided on both sides of the IDT in an aperture direction thereof,
   wherein:
   a duty ratio of electrode fingers of the gratings is larger than a duty ratio of the electrode fingers of the IDT, or a thickness of the electrode fingers of the gratings is larger than a thickness of the electrode fingers of the IDT, or a thickness of an added film provided on the electrode fingers of the gratings is larger than a thickness of an added film provided on the electrode fingers of the IDT; and
   the electrode fingers of the gratings are inclined with respect to the aperture direction.

4. An acoustic wave device comprising:
   a piezoelectric substrate that is a rotated Y-cut LiNbO$_3$ substrate;
   an IDT that is provided on the piezoelectric substrate and excites an acoustic wave; and
   gratings that are provided on both sides of the IDT in an aperture direction thereof,
   wherein:
   a duty ratio of electrode fingers of the gratings is smaller than a duty ratio of the electrode fingers of the IDT, or a thickness of the electrode fingers of the gratings is smaller than a thickness of the electrode fingers of the IDT, or a thickness of an added film provided on the electrode fingers of the gratings is smaller than a thickness of an added film provided on the electrode fingers of the IDT;

a pitch of the electrode fingers of the gratings is larger than a pitch of the electrode fingers of the IDT; and a resonant frequency of the gratings is substantially the same as a resonant frequency of the IDT.

5. An acoustic wave device comprising:

a piezoelectric substrate that is a rotated Y-cut $LiNbO_3$ substrate;

an IDT that is provided on the piezoelectric substrate and excites an acoustic wave; and gratings that are provided on both sides of the IDT in an aperture direction thereof, wherein:

a duty ratio of electrode fingers of the gratings is smaller than a duty ratio of the electrode fingers of the IDT, or a thickness of the electrode fingers of the gratings is smaller than a thickness of the electrode fingers of the IDT, or a thickness of an added film provided on the electrode fingers of the gratings is smaller than a thickness of an added film provided on the electrode fingers of the IDT;

a pitch of the electrode fingers of the gratings is larger than a pitch of the electrode fingers of the IDT; and the electrode fingers of the gratings and the electrode fingers of the IDT are connected to each other via bended regions.

* * * * *